US009709451B2

(12) United States Patent
Kaelberer et al.

(10) Patent No.: US 9,709,451 B2
(45) Date of Patent: Jul. 18, 2017

(54) MICROMECHANICAL PRESSURE SENSOR DEVICE AND CORRESPONDING MANUFACTURING METHOD

(71) Applicant: Robert Bosch GmbH, Stuttgart (DE)

(72) Inventors: Arnd Kaelberer, Schlierbach (DE); Jochen Reinmuth, Reutlingen (DE); Johannes Classen, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 268 days.

(21) Appl. No.: 14/592,610

(22) Filed: Jan. 8, 2015

(65) Prior Publication Data

US 2015/0198493 A1    Jul. 16, 2015

(30) Foreign Application Priority Data

Jan. 14, 2014   (DE) .................... 10 2014 200 500

(51) Int. Cl.
   *G01L 9/00*   (2006.01)
   *B81B 3/00*   (2006.01)
   (Continued)

(52) U.S. Cl.
   CPC .......... *G01L 9/0072* (2013.01); *B81B 3/0037* (2013.01); *B81B 7/02* (2013.01); *B81C 1/00158* (2013.01); *B81C 1/00246* (2013.01); *G01P 15/0802* (2013.01); *G01P 15/125* (2013.01); *B81B 2201/025* (2013.01); *B81B 2201/0264* (2013.01)

(58) Field of Classification Search
   CPC .. G01L 9/0072; G01P 15/0802; G01P 15/125; B81B 3/0037; B81B 7/02; B81C 1/00158; B81C 1/00246
   See application file for complete search history.

(56) References Cited

U.S. PATENT DOCUMENTS 4,368,575 A * 1/1983 Erichsen ............... G01L 9/0052
                                                        29/621.1
4,776,019 A * 10/1988 Miyatake ............. G01D 5/2417
                                                        181/158

(Continued)

FOREIGN PATENT DOCUMENTS

DE      10 2006 011 545        9/2007
DE      102007029414 A1 * 1/2009 ........... G10L 9/0072

*Primary Examiner* — David Bolduc
(74) *Attorney, Agent, or Firm* — Norton Rose Fulbright US LLP; Gerard Messina

(57) ABSTRACT

A micromechanical pressure sensor device includes: an MEMS wafer having a front side and a rear side; a first micromechanical functional layer formed above the front side of the MEMS wafer; and a second micromechanical functional layer formed above the first micromechanical functional layer. A deflectable first pressure detection electrode is formed in one of the first and second micromechanical functional layers. A fixed second pressure detection electrode is formed spaced apart from and opposite the deflectable first pressure detection electrode. An elastically deflectable diaphragm area is formed above the front side of the MEMS wafer. An external pressure is applied to the diaphragm area via an access opening in the MEMS wafer, and the wafer is connected to the deflectable first pressure detection electrode via a plug-like joining area.

14 Claims, 15 Drawing Sheets

(51) Int. Cl.
  *B81C 1/00* (2006.01)
  *G01P 15/08* (2006.01)
  *G01P 15/125* (2006.01)
  *B81B 7/02* (2006.01)

(56) References Cited

U.S. PATENT DOCUMENTS

| | | | | |
|---|---|---|---|---|
| 5,332,469 A * | 7/1994 | Mastrangelo | ........... | B23P 15/00 216/13 |
| 5,656,781 A * | 8/1997 | Kankkunen | ........... | G01L 9/0042 361/283.4 |
| 5,911,162 A * | 6/1999 | Denner | ............... | G01L 19/0618 361/283.4 |
| 5,915,281 A * | 6/1999 | Sparks | ...................... | G01L 1/18 73/862.581 |
| 5,965,821 A * | 10/1999 | Grudzien | .............. | G01L 9/0072 73/718 |
| 6,535,460 B2 * | 3/2003 | Loeppert | ............... | B81B 3/0072 367/181 |
| 6,945,115 B1 * | 9/2005 | Wang | .................... | G01L 9/0073 73/718 |
| 7,250,353 B2 | 7/2007 | Nasiri et al. | | |
| 7,442,570 B2 | 10/2008 | Nasiri et al. | | |
| 7,912,236 B2 * | 3/2011 | Dehe | ................... | H04R 19/005 29/594 |
| 7,961,897 B2 * | 6/2011 | Weigold | ................ | G01L 9/0042 381/174 |
| 8,103,027 B2 * | 1/2012 | Zhang | .................... | H04R 1/222 381/175 |
| 8,104,354 B2 * | 1/2012 | Hsu | ....................... | G01L 9/0073 29/592.1 |
| 8,216,882 B2 * | 7/2012 | Lin | ........................... | B81B 7/02 257/E29.001 |
| 8,220,330 B2 * | 7/2012 | Miller | ...................... | B81B 7/02 73/493 |
| 8,316,718 B2 * | 11/2012 | Lin | ....................... | G01L 9/0073 438/50 |
| 9,046,546 B2 * | 6/2015 | Lin | ..................... | G01P 15/0802 |
| 2002/0033048 A1 * | 3/2002 | McIntosh | ............. | G01D 5/2417 73/514.32 |
| 2002/0194919 A1 * | 12/2002 | Lee | ....................... | G01L 9/0073 73/718 |
| 2003/0019299 A1 * | 1/2003 | Horie | .................... | G01L 9/0073 73/718 |
| 2004/0237658 A1 * | 12/2004 | Ohms | ................... | G01L 9/0073 73/718 |
| 2005/0028601 A1 * | 2/2005 | Pedersen | ............... | G01L 9/0073 73/718 |
| 2005/0199069 A1 * | 9/2005 | Fortin | .................. | G01L 9/0073 73/718 |
| 2005/0229711 A1 * | 10/2005 | Ohms | ................... | G01L 9/0073 73/718 |
| 2006/0144151 A1 * | 7/2006 | Krause | ................. | G01L 9/0027 73/715 |
| 2006/0284516 A1 * | 12/2006 | Shimaoka | ............. | H04R 19/04 310/322 |
| 2007/0058825 A1 * | 3/2007 | Suzuki | ................... | H04R 19/04 381/174 |
| 2007/0189558 A1 * | 8/2007 | Ogura | ................... | B81B 7/0061 381/191 |
| 2007/0291964 A1 * | 12/2007 | Chien | .................... | H04R 19/04 381/174 |
| 2008/0022777 A1 * | 1/2008 | Tan | ........................ | G01F 23/18 73/718 |
| 2009/0120195 A1 * | 5/2009 | Willcox | ................ | G01F 1/383 73/718 |
| 2010/0052082 A1 * | 3/2010 | Lee | ....................... | B81B 7/0061 257/416 |
| 2010/0164025 A1 * | 7/2010 | Yang | .................... | H04R 19/005 257/416 |
| 2010/0212432 A1 * | 8/2010 | Kasai | ................... | H04R 19/005 73/654 |
| 2010/0284553 A1 * | 11/2010 | Conti | .................... | B81B 7/0061 381/174 |
| 2010/0330722 A1 * | 12/2010 | Hsieh | .................. | B81C 1/00246 438/53 |
| 2011/0048137 A1 * | 3/2011 | Reinmuth | ........... | G01L 19/0061 73/706 |
| 2011/0126632 A1 * | 6/2011 | McNeil | .................. | B81B 7/02 73/718 |
| 2011/0298064 A1 * | 12/2011 | Pahl | ....................... | B81B 7/0048 257/415 |
| 2011/0314922 A1 * | 12/2011 | Ismail | .................. | B81B 3/0021 73/718 |
| 2012/0049299 A1 | 3/2012 | Chou | | |
| 2012/0133005 A1 * | 5/2012 | Langeries | ............. | B06B 1/0292 257/416 |
| 2012/0186354 A1 * | 7/2012 | Okada | ................... | G01L 9/0042 73/724 |
| 2012/0235251 A1 | 9/2012 | Daneman et al. | | |
| 2012/0237073 A1 * | 9/2012 | Goida | ...................... | H04R 1/02 381/361 |
| 2012/0256282 A1 | 10/2012 | Lin et al. | | |
| 2013/0001710 A1 | 1/2013 | Daneman et al. | | |
| 2013/0243234 A1 * | 9/2013 | Zoellin | ................ | H04R 19/005 381/369 |
| 2014/0021515 A1 * | 1/2014 | Classen | ............... | B81C 1/00246 257/202 |
| 2014/0091405 A1 * | 4/2014 | Weber | ................... | B81B 3/0021 257/415 |
| 2014/0109680 A1 * | 4/2014 | Tsai | ........................ | G01L 11/04 73/702 |
| 2014/0264656 A1 * | 9/2014 | Ata | .......................... | B81B 3/001 257/416 |
| 2015/0068314 A1 * | 3/2015 | Nakamura | ............ | G01L 9/0072 73/724 |
| 2015/0078590 A1 * | 3/2015 | Daley | ................. | B81B 3/007 381/190 |
| 2015/0110309 A1 * | 4/2015 | Park | ...................... | H04R 19/005 381/190 |

* cited by examiner

MICROMECHANICAL PRESSURE SENSOR DEVICE AND CORRESPONDING MANUFACTURING METHOD

BACKGROUND OF THE INVENTION

1. Field of the Invention

The present invention relates to a micromechanical pressure sensor device and to a corresponding manufacturing method.

2. Description of the Related Art

While any arbitrary micromechanical components may also be used, the present invention and the problems underlying the present invention are explained based on silicon-based components.

Micromechanical sensor devices for measuring acceleration, rotation rate, magnetic field and pressure, for example, are generally known and are manufactured for various applications in the automotive and consumer fields in mass production. Trends in the consumer electronics are in particular the miniaturization of the components, the integration of functions, and effective cost reduction.

Today, acceleration and rotation rate sensors and also acceleration and magnetic field sensors are already manufactured as combination sensors (6d), and additionally the first 9d modules are available, in which 3-axis acceleration, rotation rate and magnetic field sensors are combined in each case in a single sensor device.

In contrast, pressure sensors are developed and produced today separately from the above-mentioned 6d and 9d modules. One essential reason for this is the necessary media access which a pressure sensor requires, contrary to inertial and magnetic sensors, and which considerably increases the complexity and the costs for packaging the pressure sensor. Further reasons for separating pressure sensors are the different MEMS manufacturing processes and the different evaluation methods. For example, pressure sensors frequently employ piezoresistive resistors for evaluation, while inertial sensors are preferably capacitively evaluated.

However, it is foreseeable that sensor devices which, in addition to inertial quantities, are also able to measure the pressure represent an interesting extension of the options for functional integration, in particular in the field of consumer electronics. Such integrated 7d modules, or 10d modules with the integration of a 3-axis magnetic sensor, could be used for navigation applications (indoor navigation), for example. The functional integration promises both a cost reduction and a reduced space requirement on the application printed circuit board.

Micromechanical combination components including pressure and inertial sensors are known from published German patent application document DE 10 2006 011 545 A1 and US Patent Application Publication 2012/0256282 A1. All these components have in common that they use a capacitive evaluation principle in which a diaphragm to which pressure is applied warps and is used as a movable electrode surface. Spaced apart thereabove or therebeneath is a planar fixed electrode as the counter electrode. In such systems, the diaphragm warping is large in the central diaphragm area and drastically decreases toward the outside, to finally become zero at the edge of the diaphragm area. In the evaluation of the change in capacitance integrated over the diaphragm surface, significant diaphragm areas in the border area thus barely contribute to the signal deviation, while the central diaphragm areas which are subject to large deflections account for only a small portion of the overall surface.

Methods of so-called vertical integration or hybrid integration or 3D integration are known, in which at least one MEMS wafer and one evaluation ASIC wafer are mechanically joined and electrically connected to each other using wafer bonding processes, for example from U.S. Pat. No. 7,250,353 B2 or U.S. Pat. No. 7,442,570 B2. These vertical integration methods are particularly attractive in combination with silicon vias and flip chip technologies, whereby the external contacting may take place as a "bare die module" or "chip scale package," i.e., without plastic packaging, as is known from US Patent Application Publication 2012/0049299 A1 or US Patent Application Publication 2012/0235251 A1, for example.

US Patent Application Publication 2013/0001710 A1 describes a method and a system for forming an MEMS sensor device, a handle wafer being bonded to an MEMS wafer via a dielectric layer. After the MEMS wafer has been structured to form the micromechanical sensor device, a CMOS wafer is bonded onto the MEMS wafer having the sensor device. At the end of the process, the handle wafer may be processed further by etching or back grinding, if necessary.

BRIEF SUMMARY OF THE INVENTION

The micromechanical pressure sensor device and the corresponding manufacturing method according to the present invention cause an increased signal sensitivity of a capacitive pressure sensor device. The manufacturing method at the same time allows capacitive acceleration, rotation rate and/or magnetic field sensors to be produced on the same chip and thus a 7D or 10D integration to be achieved.

The core of the present invention is the arrangement of a planar deflectable pressure detection electrode, which is joined to an elastically deflectable diaphragm area via a plug-like or pin-like joining area. The deflectable pressure detection electrode may thus be suspended in an approximately punctiform manner and may thus be deflected fully together with the diaphragm area.

By suspending the deflectable pressure detection electrode in the center of the movable diaphragm area, the diaphragm area transmits its maximal deflection amplitude to the entire planar deflectable pressure detection electrode. In this way, a considerably larger signal deviation (typically by more than a factor of 3) is obtained than with a system in which the diaphragm area itself is used as the movable pressure detection electrode.

As an alternative to increasing the signal sensitivity compared to known systems, the present invention allows the space requirement for the diaphragm area to be considerably reduced, i.e., greater integration to be achieved.

According to one preferred refinement, the plug-like joining area is formed centrally on the diaphragm area, so that the first pressure detection electrode may be deflected essentially untilted. In this way a maximal signal deviation is achievable.

According to one further preferred refinement, the diaphragm area is formed in a third micromechanical functional layer, which is formed beneath the first micromechanical functional layer above the front side of the MEMS wafer. In this way, an electrical connection may be implemented via the third micromechanical functional layer.

According to one further preferred refinement, the deflectable first pressure detection electrode is formed in the first micromechanical functional layer, the fixed second pressure detection electrode being formed in the second micromechanical functional layer.

According to one further preferred refinement, the deflectable first pressure detection electrode is formed in the second micromechanical functional layer, the fixed second pressure detection electrode being formed in the first micromechanical functional layer.

According to one further preferred refinement, the deflectable first pressure detection electrode is formed in the second micromechanical functional layer, the fixed second pressure detection electrode being formed in a capping device, which is bonded to the MEMS wafer. Such a structure is very easy to produce.

According to one further preferred refinement, the plug-like joining area is formed decentrally on the diaphragm area, so that the first pressure detection electrode is deflectable in a tilted manner, two fixed second pressure detection electrodes which are electrically insulated from each other being formed spaced apart from and opposite the deflectable first pressure detection electrode, and the first pressure detection electrode being differently deflectable with respect to these electrodes. In this way, a differential system may be produced.

According to one further preferred refinement, the deflectable first pressure detection electrode is formed in the first micromechanical functional layer, the fixed second pressure detection electrode being formed in the second micromechanical functional layer, and a further fixed second pressure detection electrode being formed in a third micromechanical functional layer, which is formed beneath the first micromechanical functional layer above the front side of the MEMS wafer. In this way, an alternative differential system may be produced.

According to one further preferred refinement, the deflectable first pressure detection electrode is electrically connected via a spring device which is formed in the associated micromechanical functional layer. In this way, the deflectable first pressure detection electrode may be independently electrically connected.

According to one further preferred refinement, a capping device is provided, which is bonded to the second micromechanical functional layer for enclosing a cavern at a predetermined enclosed pressure. In this way, an arbitrary reference pressure may be set.

According to one further preferred refinement, the capping device is an evaluation wafer. This results in a very compact system.

According to one further preferred refinement, the access opening is a through-hole in the MEMS wafer through which the pressure may be applied to the diaphragm area from the rear side.

According to one further preferred refinement, the access opening is a lateral access opening on the front side of the MEMS wafer.

DETAILED DESCRIPTION OF THE INVENTION

Figure 1A:
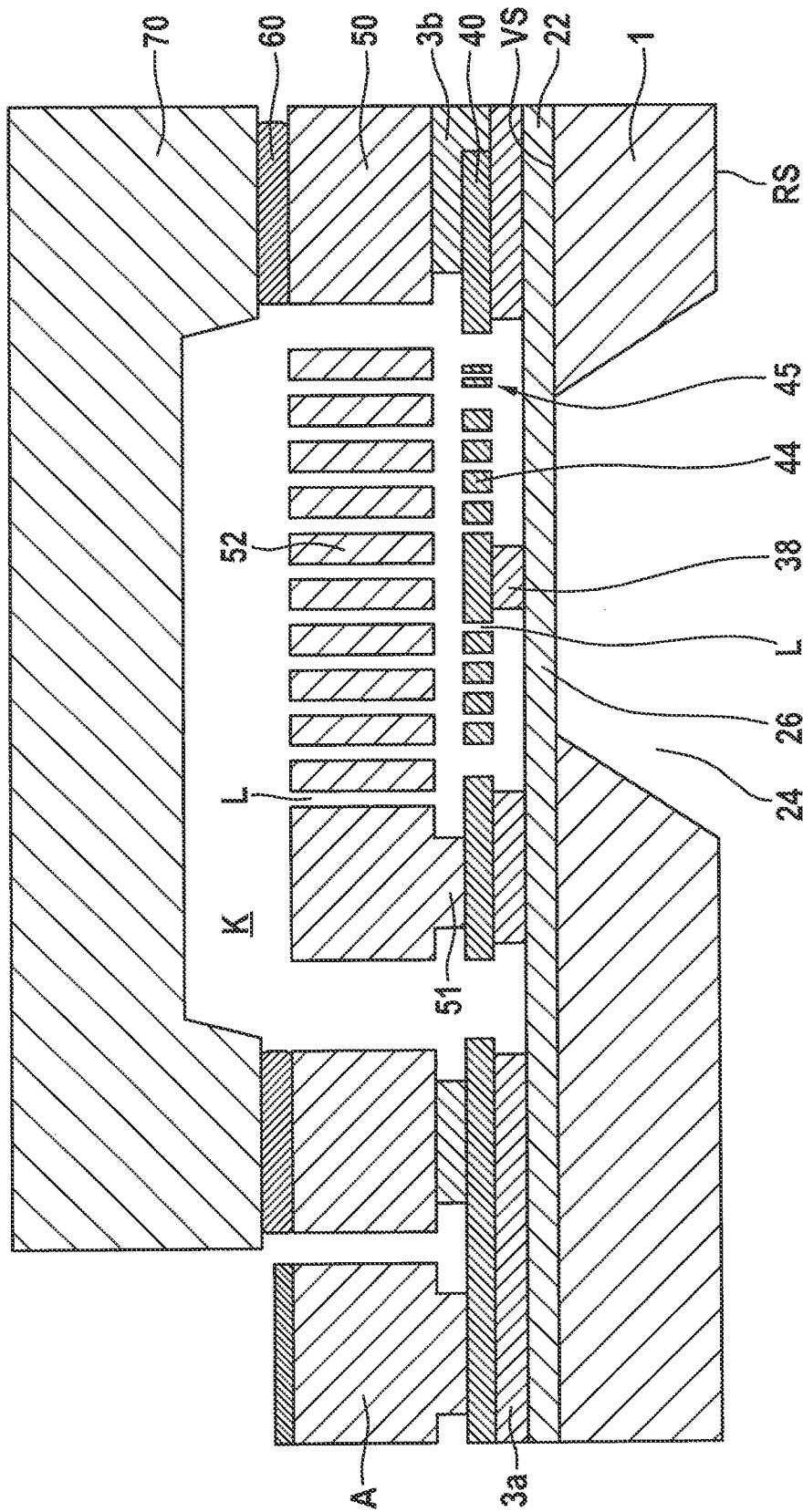
FIGS. 1a) and 1b) show schematic cross-sectional views to explain a micromechanical pressure sensor device and a corresponding manufacturing method according to a first specific embodiment of the present invention.

In the figures, identical or functionally equivalent elements are denoted by identical reference numerals.

FIGS. 1a) and 1b) show schematic cross-sectional views to explain a micromechanical pressure sensor device and a corresponding manufacturing method according to a first specific embodiment of the present invention.

In FIGS. 1a) and 1b) reference numeral 1 denotes an MEMS wafer made of silicon, which has a front side VS and a rear side RS. A highly doped cover layer 22 is applied to front side VS of MEMS wafer 1, at which a KOH etching step starting from rear side RS for forming an access opening 24, which hereafter is also referred to as a through-hole, comes to a stop. In this way, it is possible to expose, from rear side RS, a diaphragm area 26 having the thickness of cover layer 22.

From front side VS, a first micromechanical functional layer 40 and a second micromechanical functional layer 50, which are each made of silicon, are structured and exposed using standard methods of surface micromechanics. A first insulating layer 3a, for example made of silicon dioxide, is provided between cover layer 22 and first micromechanical functional layer 40. A second insulating layer 3b, for example also made of silicon dioxide, is provided between first micromechanical functional layer 40 and second micromechanical functional layer 50.

An anisotropic etching process for silicon and an isotropic etching process for silicon dioxide, the etching medium in the latter spreading through etching channels L, may be used to form a deflectable first pressure detection electrode 44 in first micromechanical functional layer 40 and a fixed second pressure detection electrode 52 in second micromechanical functional layer 50.

The deflectable first pressure detection electrode is connected in an electrically insulating manner to the center of diaphragm area 26 via a plug-like or pin-like joining area 38 of first insulating layer 3a made of silicon dioxide. An electrical connection of deflectable first pressure detection electrode 44 takes place via a spring device 45, which is relatively soft and in particular allows deflections in the z direction, i.e., perpendicular to the chip plane.

The fixed second pressure detection electrode is joined to first micromechanical functional layer 40 via an anchoring area 51 and may also be electrically contacted via the same.

A capping is formed with the aid of a cap wafer 70 above the pressure detection electrode structure having first pressure detection electrode 44 which is deflectable over diaphragm area 26 and fixed second pressure detection electrode 52, the cap wafer being applied to second micromechanical functional layer 50 in a hermetically sealing manner via a bonding area 60.

Electrical signals may be conducted to the outside from cavern K formed by the capping having the detection electrode structure via an exemplary connecting area A, which is connected to first micromechanical functional layer 40 outside the capped area.

Figure 1B:
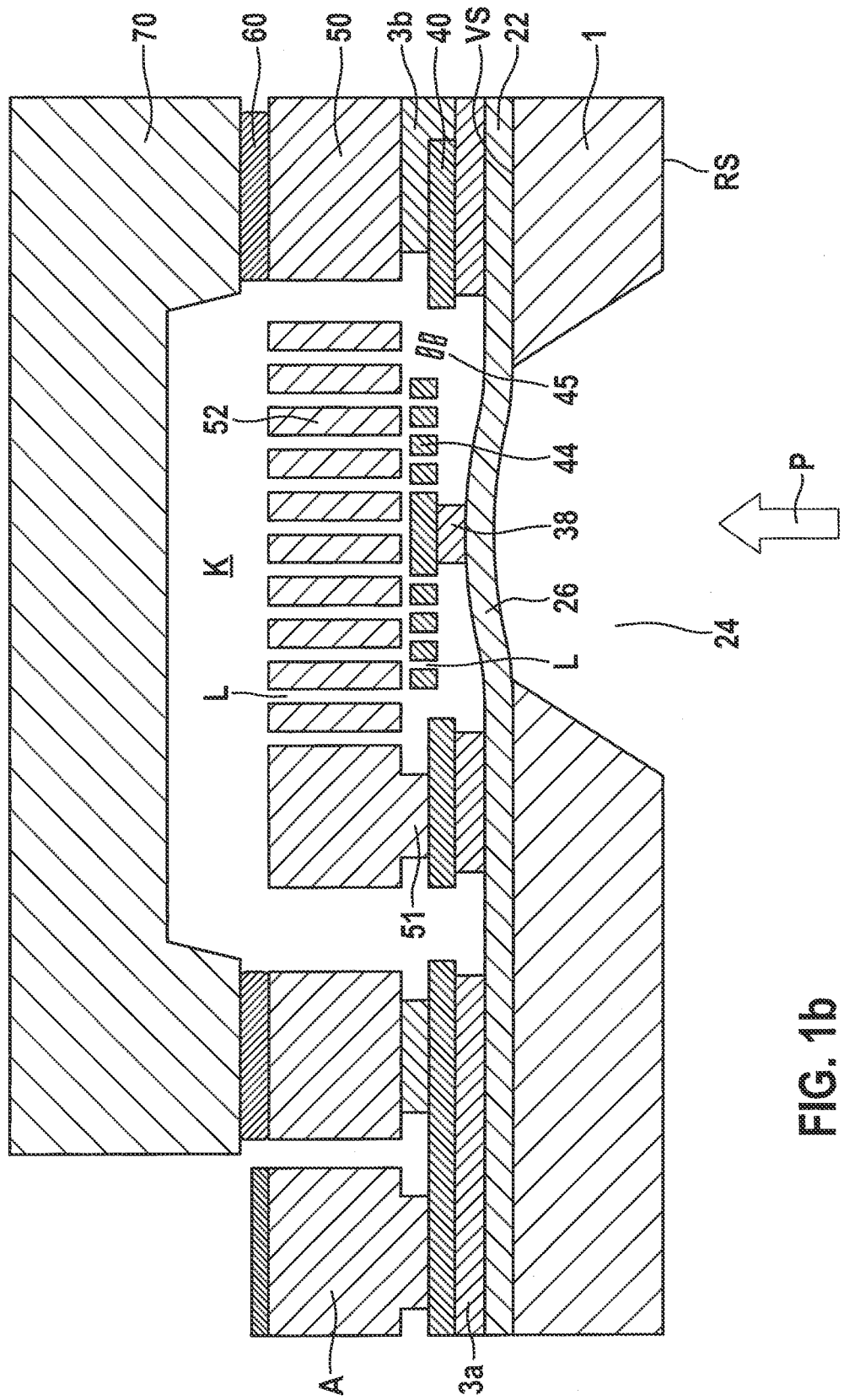

Such a system allows a capacitive evaluation of a deflection of diaphragm area 26 using an external pressure P, as is shown in FIG. 1b), the maximal deflection of diaphragm area 26 being transmitted to the entire surface of deflectable first pressure detection electrode 44, without the latter tilting. As a result, the signal deviation is considerably larger than when using the diaphragm area directly as the deflectable first pressure detection electrode, as is the case with known methods.

The manufacturing method for the first specific embodiment shown in FIGS. 1a), b) exclusively provides for steps which are known from micromechanics, in particular depositing cover layer 22 on front side VS of MEMS wafer 1, and depositing, structuring and exposing insulating layers 3a, 3b made of silicon dioxide and micromechanical functional layers 40, 50 for producing the pressure detection electrode structure. The bonding of cap wafer 60, the KOH etching from rear side RS of MEMS wafer 1 for forming through-hole 24, the exposing of connecting areas A, and a trenching of the cap side for exposing connecting areas A are also standard processes.

Figure 2:
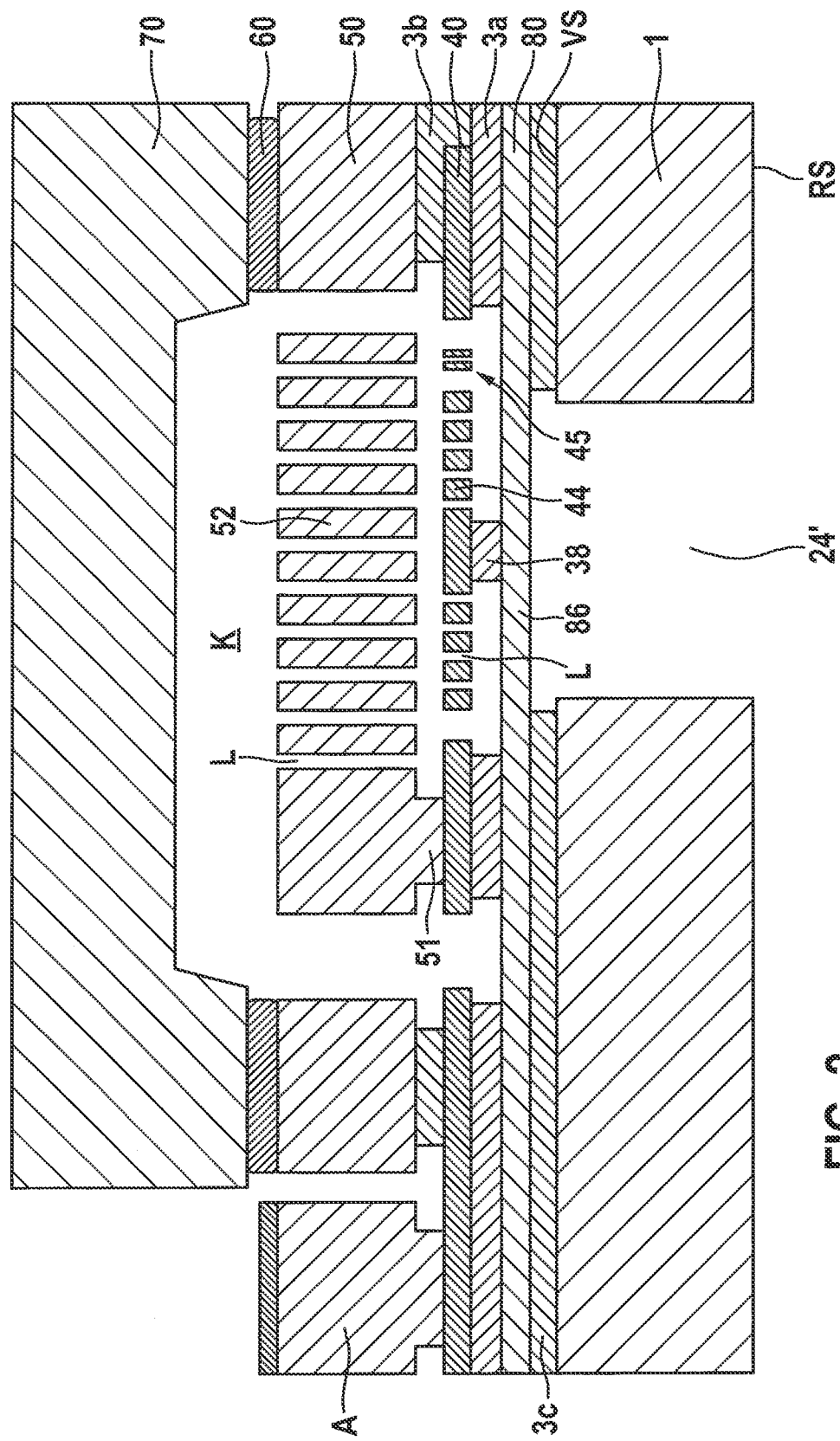
FIG. 2 shows a schematic cross-sectional view to explain a micromechanical pressure sensor device and a corresponding manufacturing method according to a second specific embodiment of the present invention.

FIG. 2 shows a schematic cross-sectional view to explain a micromechanical pressure sensor device and a corresponding manufacturing method according to a second specific embodiment of the present invention.

Contrary to the above-described first specific embodiment, a third micromechanical functional layer 80 made of silicon is provided in the second specific embodiment, which is electrically decoupled from front side VS of MEMS wafer 1 by a third insulating layer 3c made of silicon dioxide. In this specific embodiment, diaphragm area 86 is formed in third micromechanical functional layer 80. In this case, the exposure of diaphragm area 86 and the formation of through-hole 24' take place from rear side RS of MEMS wafer 1 using an anisotropic trench process and a subsequent oxide etching step, in which the third insulating layer made of oxide is removed in diaphragm area 86. Silicon dioxide and silicon have different internal stresses and different thermal coefficients of expansion. By removing the silicon dioxide, undesirable deformations of diaphragm area 86 as a function of the temperature are kept low, resulting in temperature-stable values for offset and sensitivity of the pressure sensor device.

In the second specific embodiment, diaphragm area 86 is joined to deflectable first pressure detection electrode 44 via plug-like narrow joining area 38 made of the silicon dioxide of first insulating layer 3a.

Figure 3A:
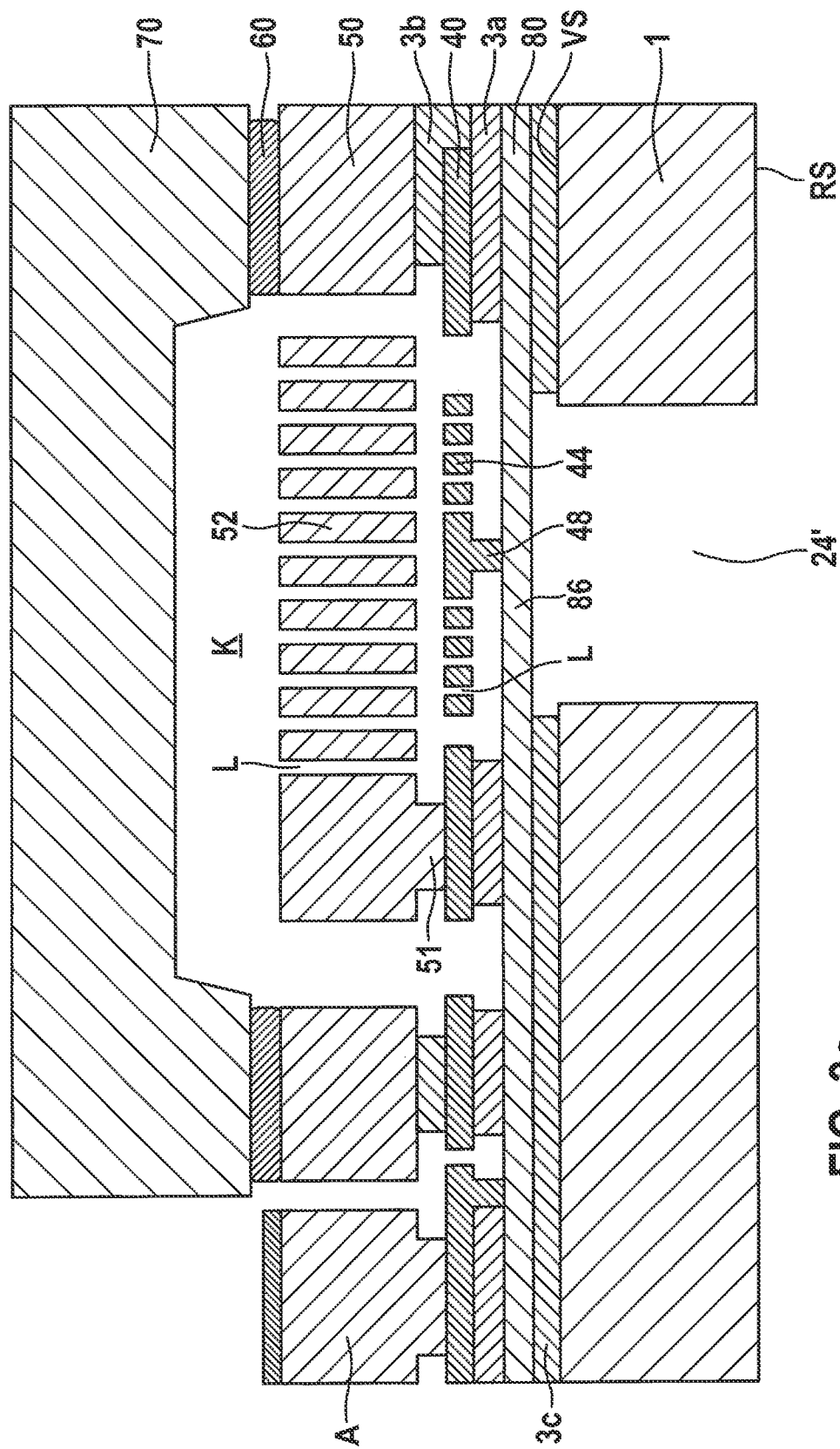
FIGS. 3a) and 3b) show schematic cross-sectional views to explain a micromechanical pressure sensor device and a corresponding manufacturing method according to a third specific embodiment of the present invention.

FIGS. 3a) and 3b) show schematic cross-sectional views to explain a micromechanical pressure sensor device and a corresponding manufacturing method according to a third specific embodiment of the present invention.

The third specific embodiment takes into consideration that the plug-like joining area of the first and second specific embodiments represents a certain risk with regard to the temperature stability of the pressure sensor device due to the addressed thermal mismatch between silicon dioxide and silicon. Moreover, in the first two specific embodiments the size of the plug-like joining area made of silicon dioxide is determined by a time-controlled etching process, preferably etching using gaseous HF, which is subject to certain manufacturing variances. In this way, the surface of the joining area made of oxide and, as a consequence, the resilience of the diaphragm area are subject to certain fluctuations in the first two specific embodiments.

Contrary to the second specific embodiment, plug-like joining area 48 in the third specific embodiment is made of silicon of first micromechanical functional layer 40, which is easily achievable by a corresponding opening of first insulating layer 3a prior to depositing first micromechanical functional layer 40.

Such a plug-like joining area made of silicon not only eliminates the risk of the thermal mismatch, but also the need for the electrical connection via spring device 45. In this case, deflectable first pressure detection electrode 44 is thus electrically connected to third micromechanical functional layer 80 in diaphragm area 86 via plug-like joining area 48 made of silicon.

Figure 3B:
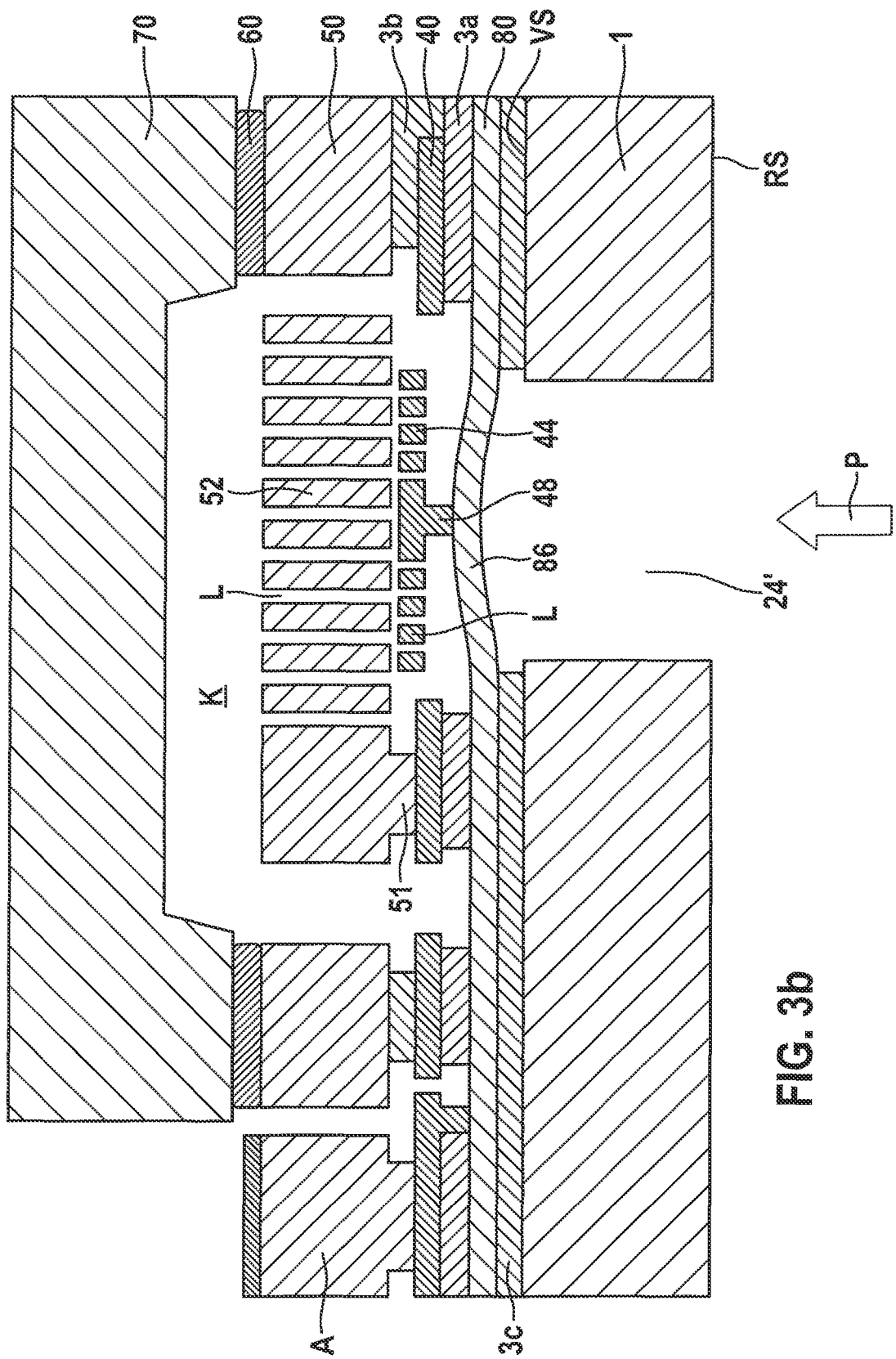

FIG. 3b) shows the deflected state during the application of an external pressure P.

Figure 4:
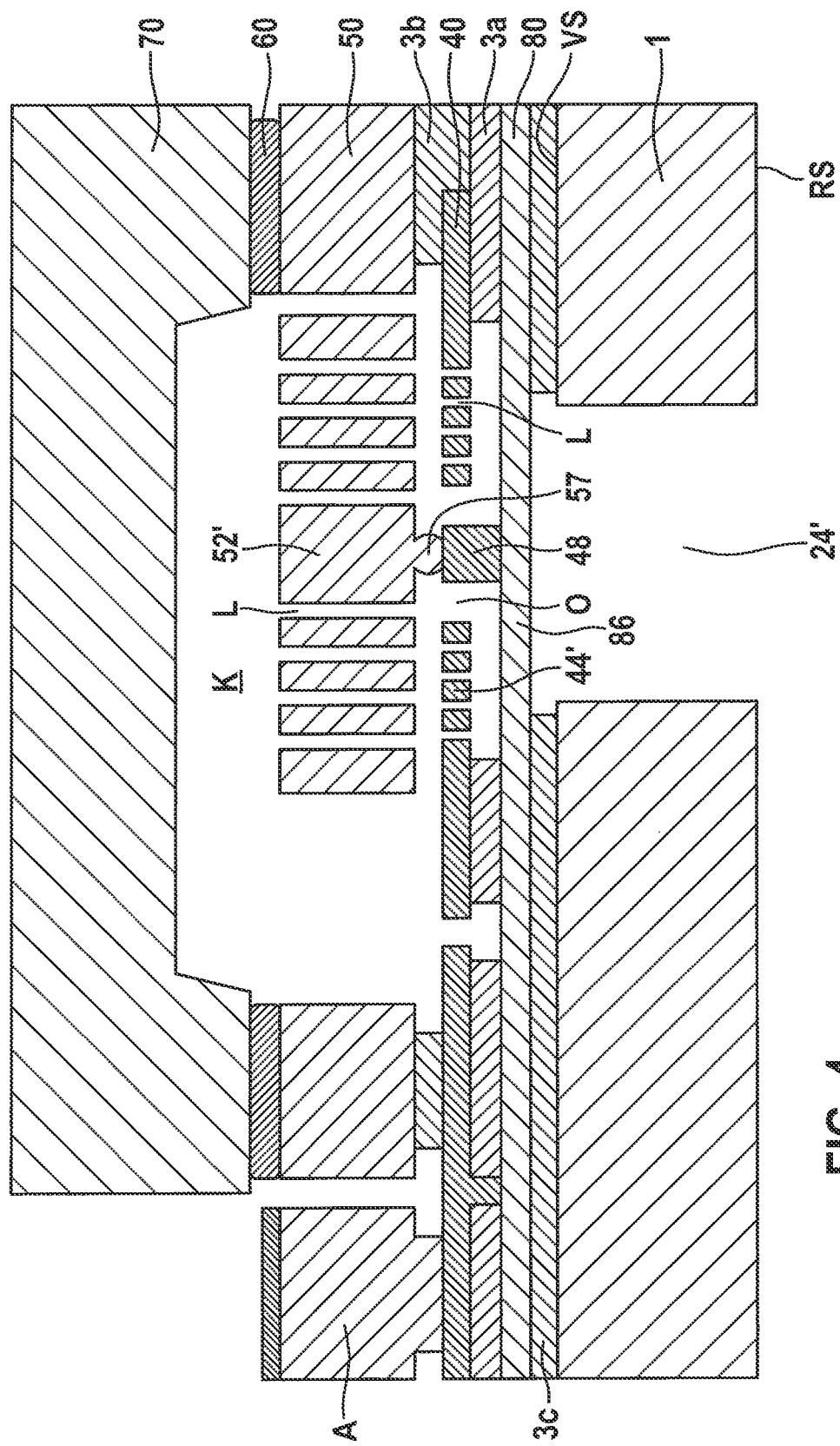
FIG. 4 shows a schematic cross-sectional view to explain a micromechanical pressure sensor device and a corresponding manufacturing method according to a fourth specific embodiment of the present invention.

FIG. 4 shows a schematic cross-sectional view to explain a micromechanical pressure sensor device and a corresponding manufacturing method according to a fourth specific embodiment of the present invention.

Contrary to the third specific embodiment, deflectable first pressure detection electrode 52' in the fourth specific embodiment is formed in second micromechanical functional layer 50, while fixed second pressure detection electrode 44' is formed in first micromechanical functional layer 40.

The connection of diaphragm area 86 of third micromechanical functional layer 80 made of silicon to deflectable first pressure detection electrode 52' in second micromechanical functional layer 50 takes place with the aid of a plug-like joining area 48, 57, which is formed through an opening O in fixed second pressure detection electrode in first micromechanical functional layer 40. Plug-like joining area 48, 57 has a first subarea 48 made of silicon of first micromechanical functional layer 40 and a second subarea 57 made of silicon of second micromechanical functional layer 50. The stepped shape of plug-like joining area 48, 57 is based on the need to provide a certain allowance in lower subarea 48 to take tolerances in the etching process of second insulating layer 3b into consideration.

The above-described first through fourth specific embodiments have an individual useful capacitance. Highly sensitive capacitive evaluation methods are frequently based on so-called differential evaluation methods, in which a capacitance difference between originally identical capacitances is evaluated. With such methods, the signal of the first capacitance particularly preferably becomes larger to the extent that the signal of the second capacitance becomes smaller. A reference capacitance remains constant with a slightly simpler system, while the actual sensor capacitance is variable. In the latter case, the reference capacitance is preferably also present on MEMS wafer 1 since then, for technological reasons, particularly good matching between the useful capacitance and the reference capacitance is achievable. In contrast, the useful and reference capacitances may vary independently of each other when using a reference capacitance in an additional ASIC chip, since the two components are produced independently of each other and are therefore subject to different process fluctuations.

It is therefore advantageous in some circumstances to create a further, but immovable electrode (not shown in the figures) having the same capacitance as the reference capacitance in the above-described first through fourth specific embodiments, in addition to the deflectable first pressure detection electrode. This may be achieved, for example, by forming a second identical capacitor system on the front side of MEMS wafer 1, however in which no pressure sensor diaphragm is created from rear side RS.

Figure 5A:
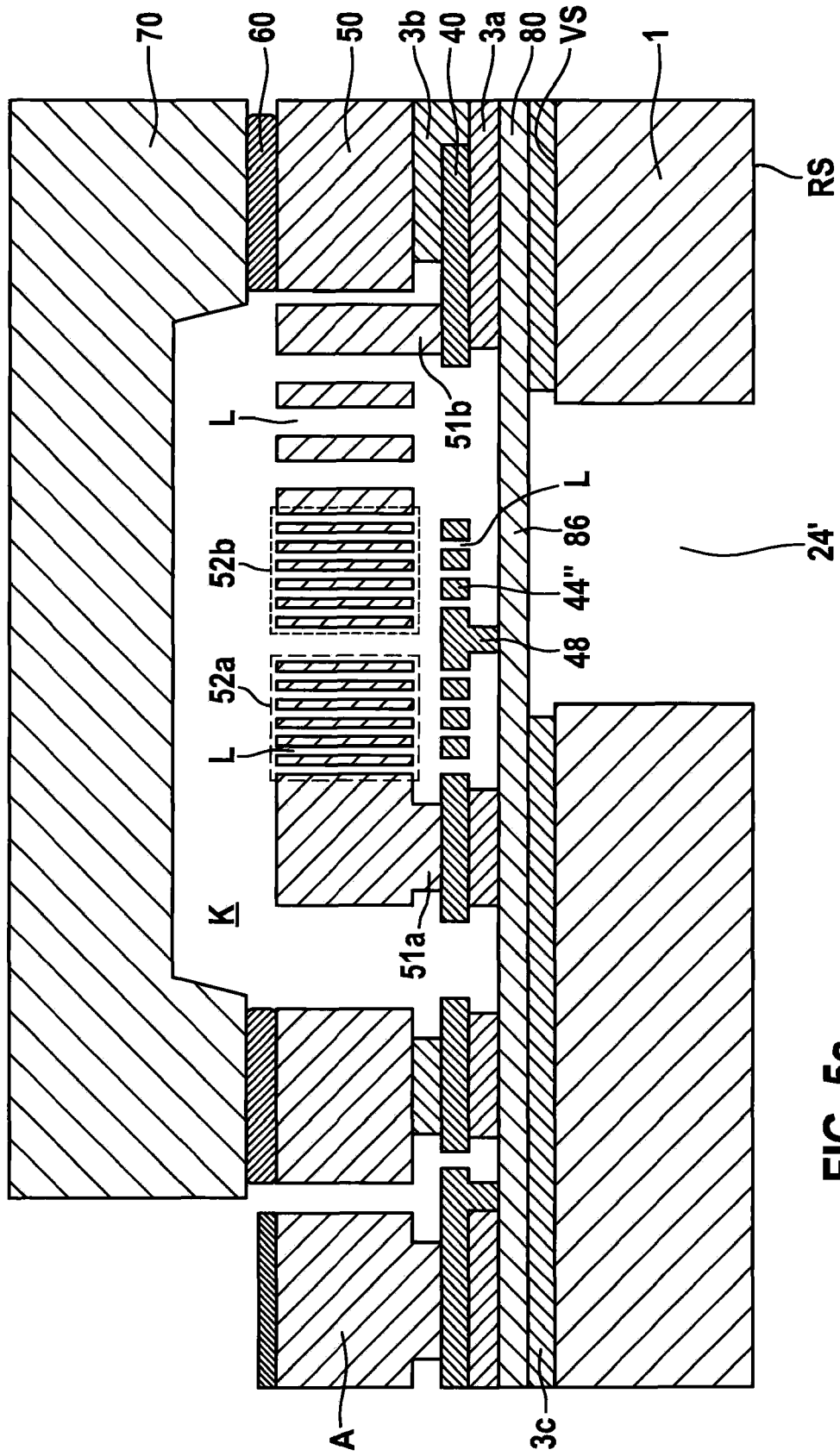
FIGS. 5a) and 5b) show schematic cross-sectional views to explain a micromechanical pressure sensor device and a corresponding manufacturing method according to a fifth specific embodiment of the present invention.

FIGS. 5a) and 5b) show schematic cross-sectional views to explain a micromechanical pressure sensor device and a corresponding manufacturing method according to a fifth specific embodiment of the present invention.

The fifth specific embodiment shows a further form of a possible differential signal evaluation. Contrary to the third specific embodiment, the connection of deflectable first pressure detection electrode 44" via plug-shaped joining area 48 made of silicon of first micromechanical functional layer 40 does not take place at the center of diaphragm area 86, but decentrally. Moreover, in this specific embodiment two fixed second pressure detection electrodes 52a, 52b are provided, which are electrically separated from each other and which are joined to first micromechanical functional layer 40 via a respective anchoring 51a or 51b.

Figure 5B:
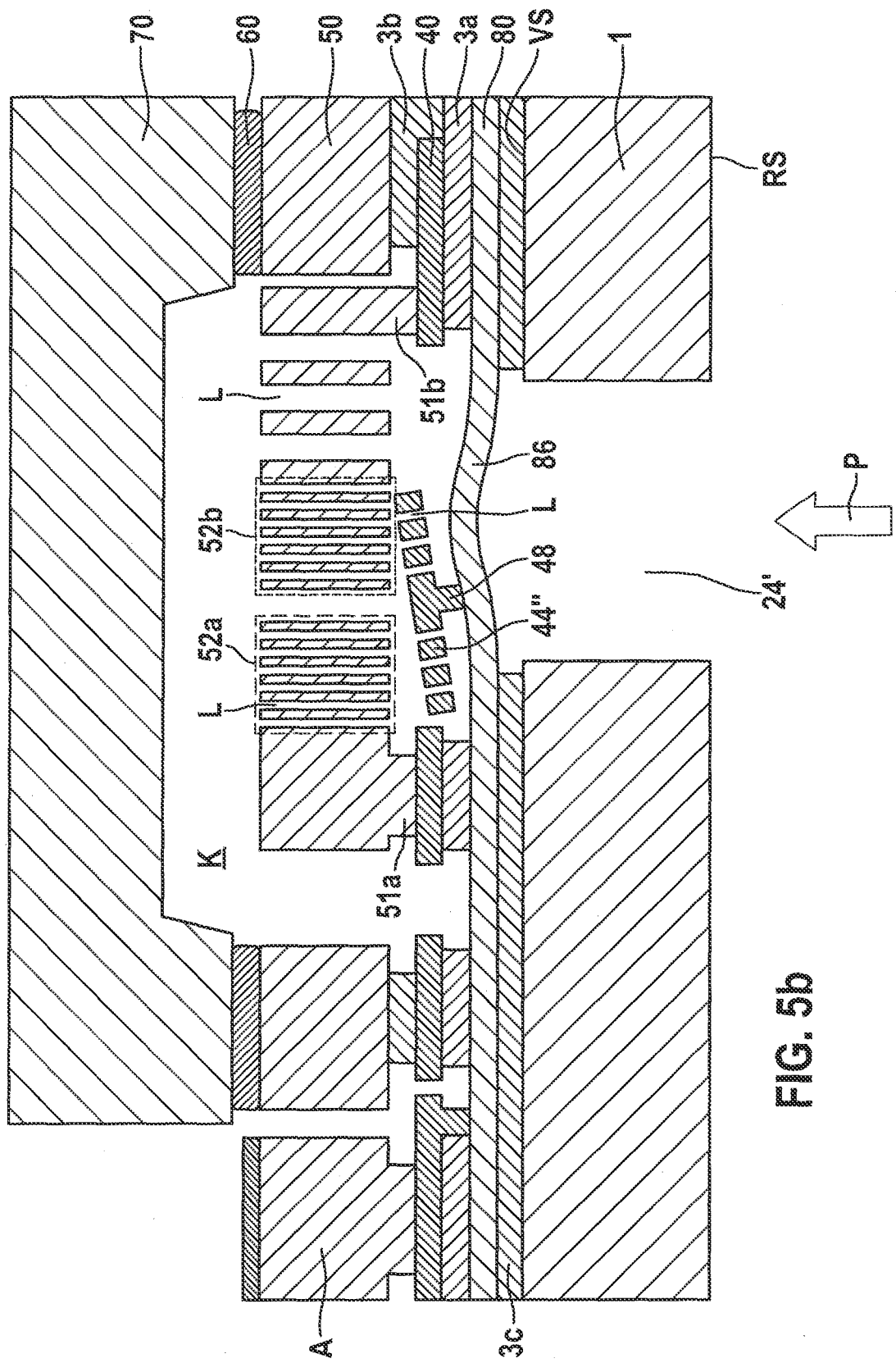

As is shown in FIG. 5b), deflectable first pressure detection electrode 44" tilts with respect to the normal of MEMS wafer 1 during a deflection of diaphragm area 86 as a result of an applied external pressure P. As a result of this tilting, the capacitance becomes smaller in the area of first fixed second pressure detection electrode 52a and greater in the area of second fixed second pressure detection electrode 52b. In this way, a differential evaluation of two useful electrode areas is possible. Naturally, it is also possible to situate multiple deflectable first pressure detection electrodes in various locations decentrally on diaphragm area 86 instead of a single not centrally situated deflectable first pressure detection electrode 44", to optimally utilize the overall surface of diaphragm area 86.

Figure 6A:
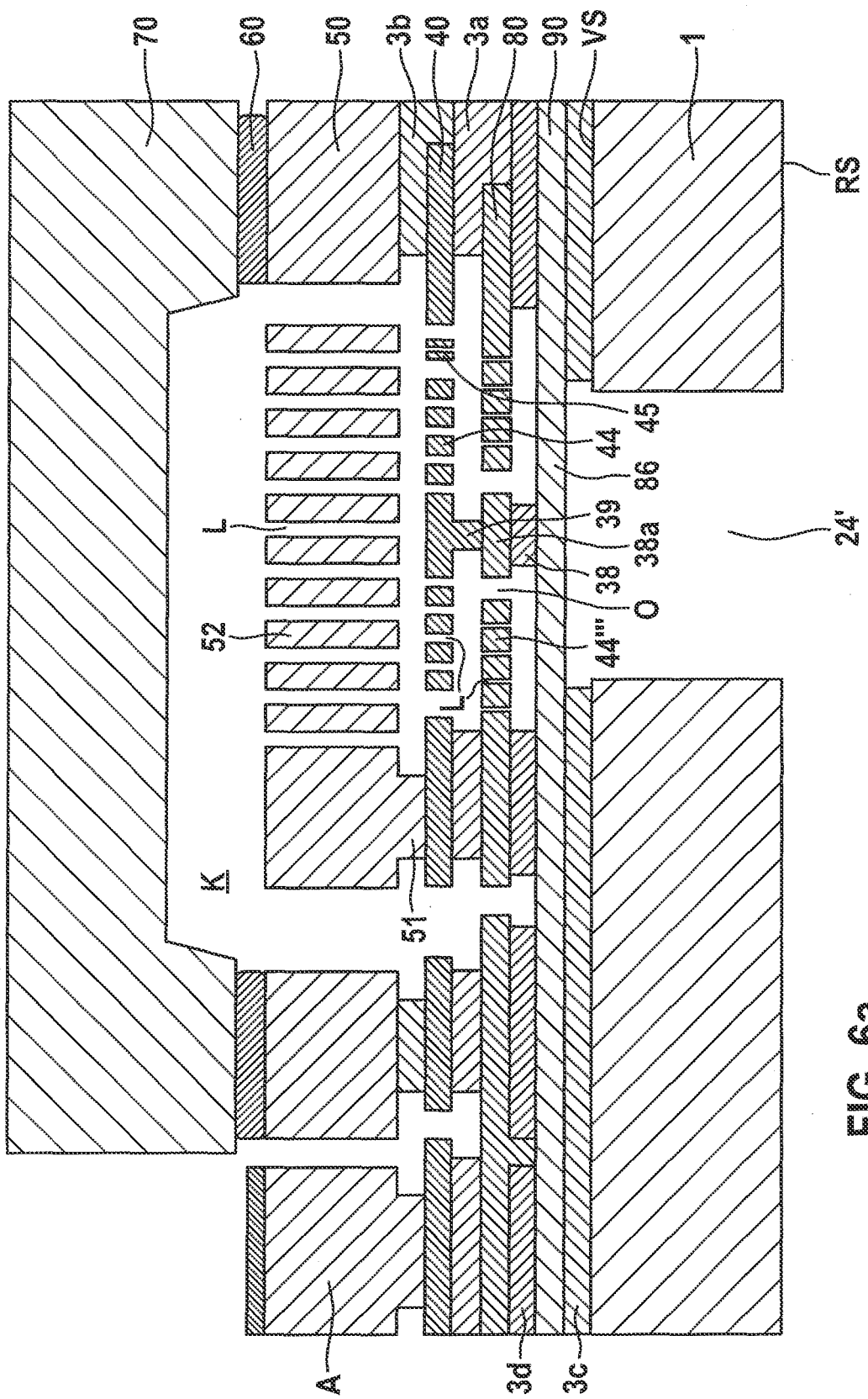
FIGS. 6a) and 6b) show schematic cross-sectional views to explain a micromechanical pressure sensor device and a corresponding manufacturing method according to a sixth specific embodiment of the present invention.

FIGS. 6a) and 6b) show schematic cross-sectional views to explain a micromechanical pressure sensor device and a corresponding manufacturing method according to a sixth specific embodiment of the present invention.

An additional fourth micromechanical functional layer 90 made of silicon is provided in the sixth specific embodiment, which is separated from front side VS of MEMS wafer 1 by a fourth insulating layer 3d made of silicon dioxide of third micromechanical functional layer 80 and by third insulating layer 3c made of silicon dioxide.

In this specific embodiment, diaphragm area 86 is structured from fourth micromechanical functional layer 90, analogously to the second specific embodiment.

In the sixth specific embodiment, a first fixed second pressure detection electrode 52 is provided above deflectable first pressure detection electrode 44.

Analogously to the fourth specific embodiment, third micromechanical functional layer 80 is provided with a second fixed second pressure detection electrode 44''', which has an opening O through which plug-like joining area 38, 38a, 39 is guided, which joins diaphragm area 86 to deflectable first pressure detection electrode 44. Plug-like joining area 38, 38a, 39 in this specific embodiment has three subareas and is also stepped for process reasons.

A first subarea 38 is formed of the silicon dioxide of fourth insulating layer 3d. A second subarea 38a is formed of the silicon of third micromechanical functional layer 80, and a third subarea 39 is formed of the silicon of first micromechanical functional layer 40.

In this sixth specific embodiment as well, the electrical connection of deflectable first pressure detection electrode 44 takes place via soft spring device 45, which does not impede the deflection in the z direction.

The advantage of this system is that fixed second pressure detection electrodes 52, 44''' may be formed both above and beneath deflectable first pressure detection electrode 44. In this way, a differential evaluation of the capacitance signal is possible without taking up further space to implement a reference capacitance in MEMS wafer 1 or in the ASIC wafer (not shown).

Figure 6B:
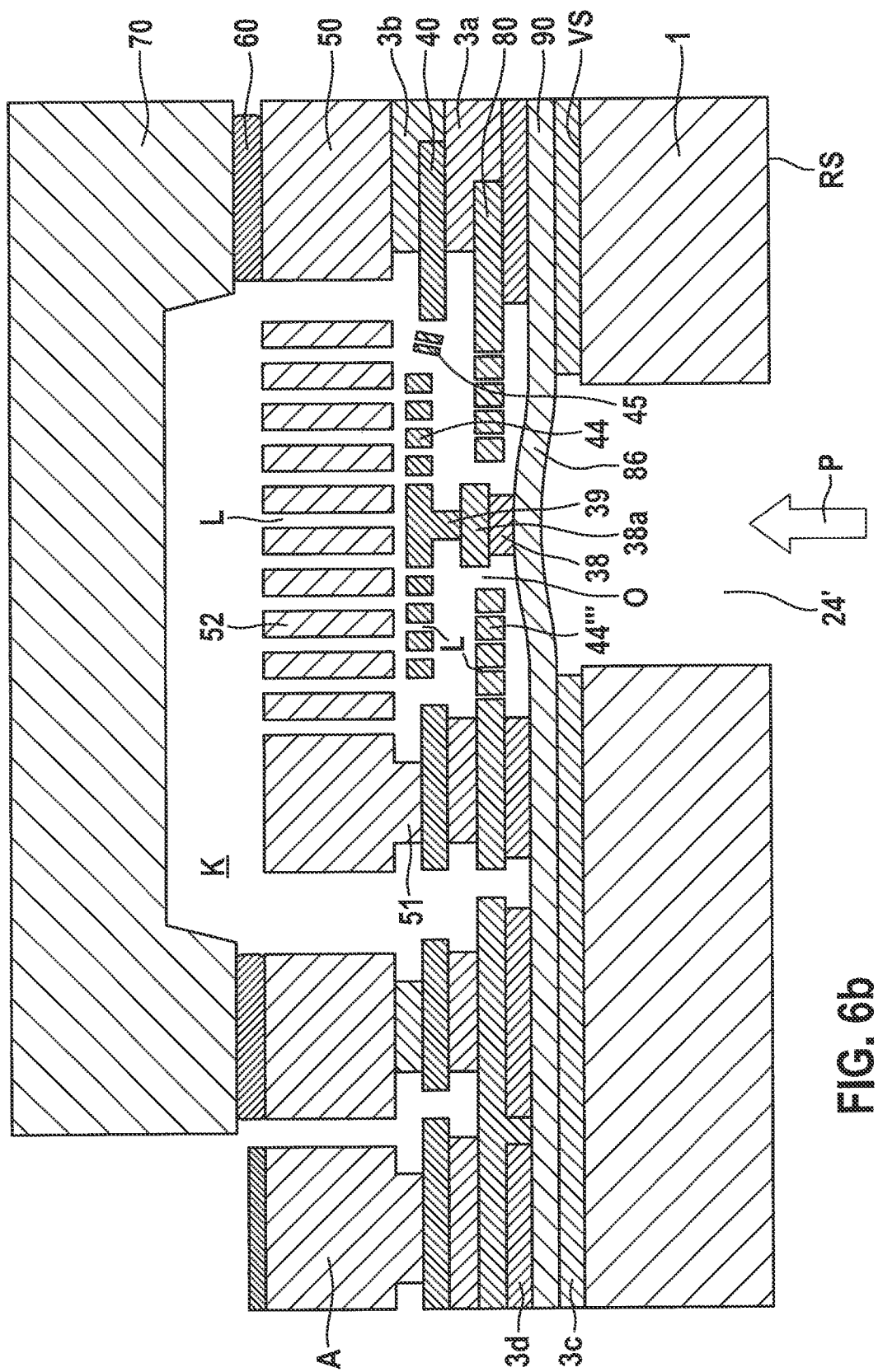

FIG. 6b) shows the deflected state during the application of external pressure P, which is not tilted here as well, since plug-like joining area 38, 38a, 39 is situated in the center of diaphragm area 86.

Figure 7:
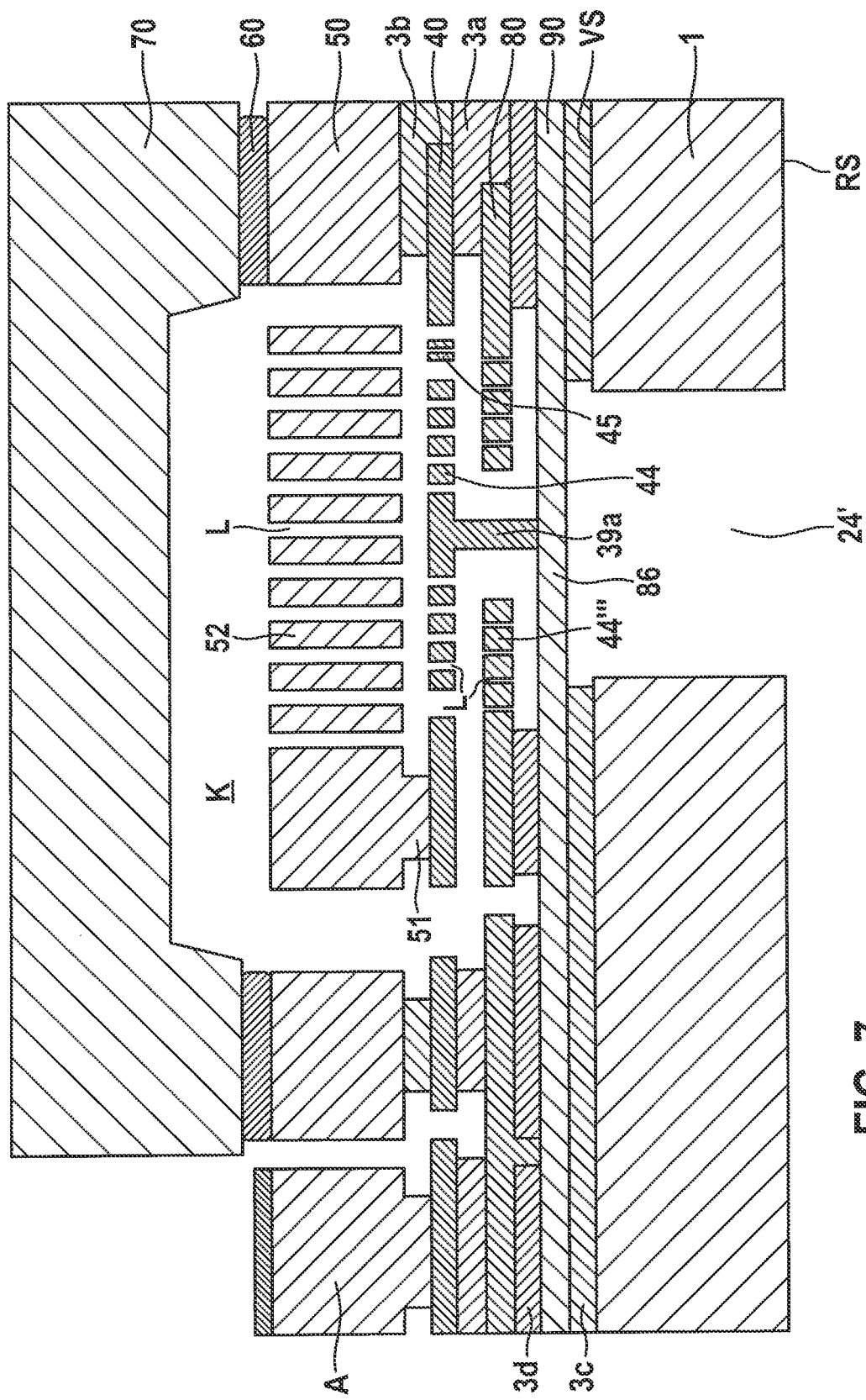
FIG. 7 shows a schematic cross-sectional view to explain a micromechanical pressure sensor device and a corresponding manufacturing method according to a seventh specific embodiment of the present invention.

FIG. 7 shows a schematic cross-sectional view to explain a micromechanical pressure sensor device and a corresponding manufacturing method according to a seventh specific embodiment of the present invention.

In the seventh specific embodiment, a plug-like joining area 39a formed entirely of silicon is formed, instead of subarea 38 made of oxide in the sixth specific embodiment, and is formed in this specific embodiment of the silicon of first micromechanical functional layer 40 and of third micromechanical functional layer 80. An illustration of process-related steps was dispensed with here.

However, it must be taken into consideration in the seventh specific embodiment that, opposite lower fixed second pressure detection electrode 44''', diaphragm area 86 generates a signal which is opposite that of deflectable first pressure detection electrode 44. This may be taken into consideration, for example, by a suitable selection of the thicknesses of oxide layers 3a through 3d and/or by a suitable selection of the surfaces of pressure detection electrodes 44, 44'''.

This problem does not occur in the sixth specific embodiment since diaphragm area 36 is electrically insulated from deflectable first pressure detection electrode 44.

Figure 8:
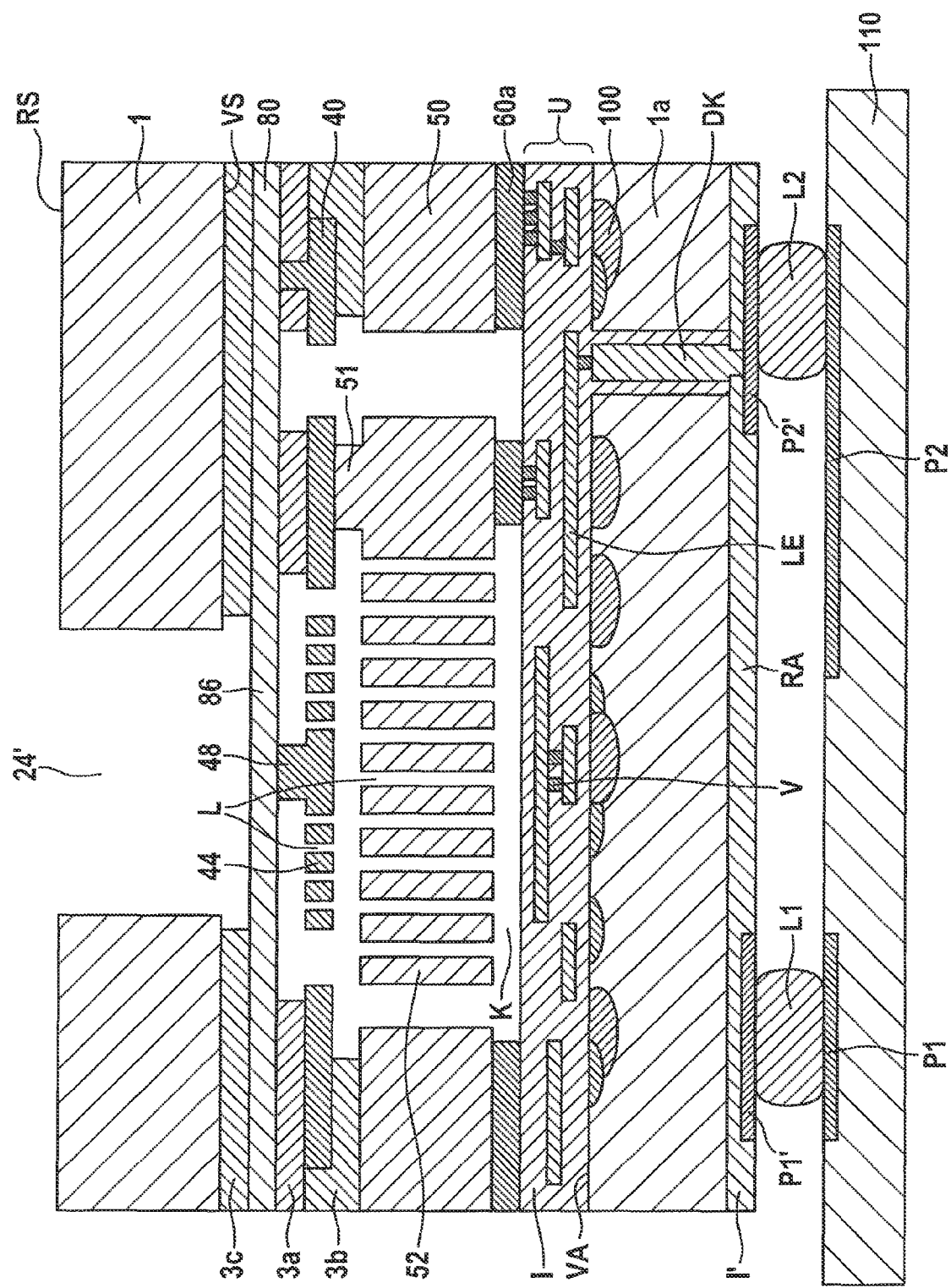
FIG. 8 shows a schematic cross-sectional view to explain a micromechanical pressure sensor device and a corresponding manufacturing method according to an eighth specific embodiment of the present invention.

FIG. 8 shows a schematic cross-sectional view to explain a micromechanical pressure sensor device and a corresponding manufacturing method according to an eighth specific embodiment of the present invention.

The eighth specific embodiment shows a modification of the third specific embodiment with respect to the capping with subsequent assembly.

Instead of cap wafer 70 of the third specific embodiment, in this specific embodiment an evaluation wafer 1a is used for capping, preferably a CMOS wafer, which includes a plurality of integrated CMOS circuits 100. Front side VA of evaluation wafer 1a is provided with a rewiring device U, which includes a plurality of printed conductor levels LE which are joined to each other via interposed vias V. Printed conductor levels LE are embedded into a multitude of insulating layers, which are denoted as a single insulating layer I for the sake of simplification.

Evaluation wafer 1a is bonded to second micromechanical functional layer 50 via the rewiring device with the aid of a bond connection 60a to thus form a capping to create cavern K on the one hand, and to establish an electrical contacting at desired locations via rewiring device U on the other hand.

The electrical signals may be conducted through evaluation wafer 1a via a via device DK extending from printed conductor levels LE to rear side RA of evaluation wafer 1a, so that an assembly may take place on rear side RA of evaluation wafer 1a.

For assembly, a rear-side insulating layer I', in which connecting pads P1', P2' are embedded, is provided on evaluation wafer 1a. These connecting pads P1', P2' may be joined to corresponding connecting pads P1, P2 of a carrier substrate 110 with the aid of solder balls L1, L2, for example.

Bond connection 60a may be a eutectic aluminum-germanium bond connection, for example, uppermost printed conductor level LE of the rewiring device being made of aluminum, and the germanium being provided on second micromechanical functional layer 50.

Such a bond connection 60a is electrically conducting in order to conduct the electrical signals from second micromechanical functional layer 50 to evaluation wafer 1a via rewiring device U.

The advantage of this eighth specific embodiment is to equal degrees the very compact design, the cost-effective assembly of MEMS and ASIC, and the automatically present media access for the pressure sensor device.

All further specific embodiments of the first through the seventh specific embodiments are naturally also compatible with this combination of vertical integration and chip scale package.

Figure 9:
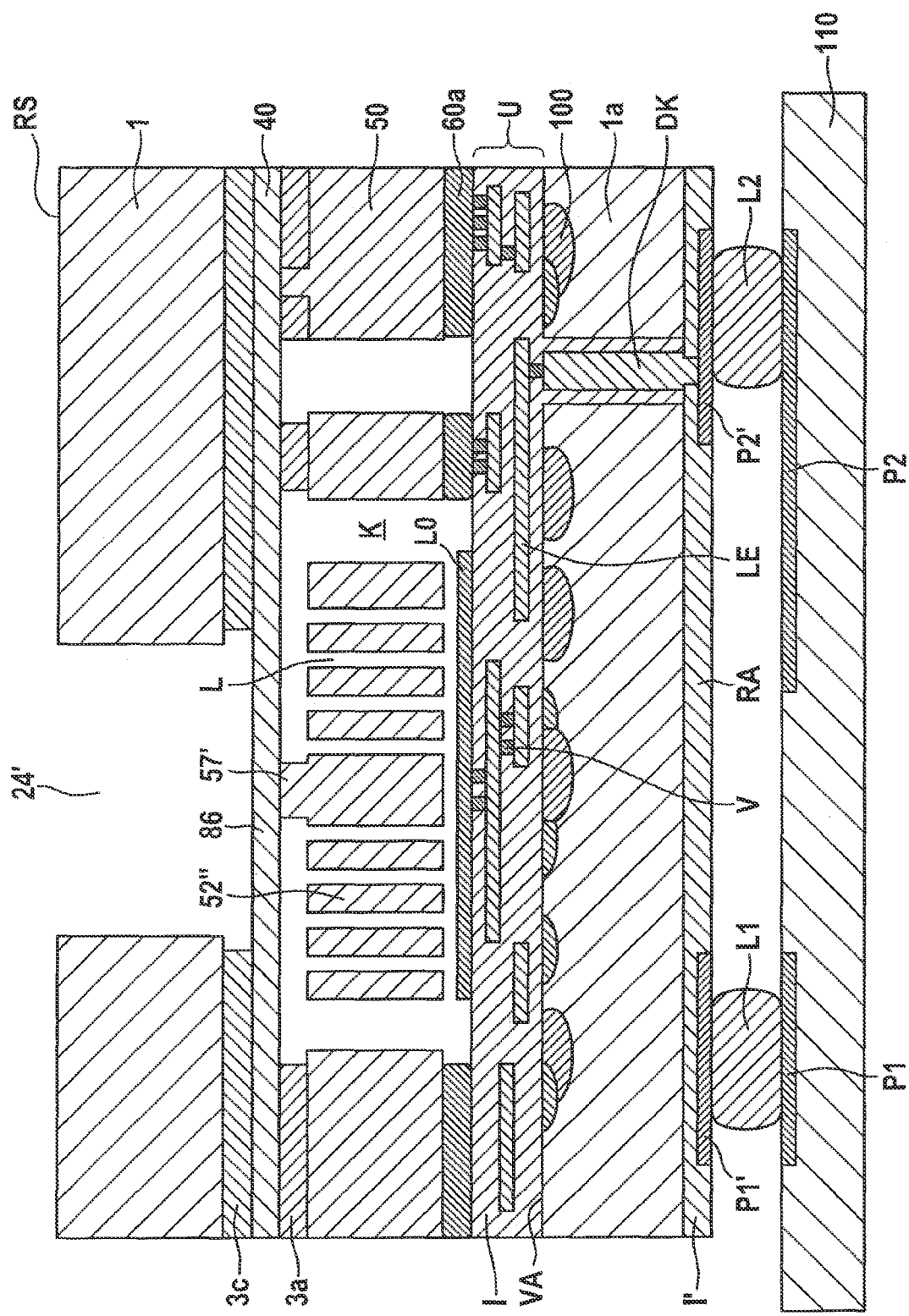
FIG. 9 shows a schematic cross-sectional view to explain a micromechanical pressure sensor device and a corresponding manufacturing method according to a ninth specific embodiment of the present invention.

FIG. 9 shows a schematic cross-sectional view to explain a micromechanical pressure sensor device and a corresponding manufacturing method according to a ninth specific embodiment of the present invention.

In the ninth specific embodiment, the capping and assembly correspond to the eighth specific embodiment, however diaphragm area 86 here is formed in first micromechanical functional layer 40, and deflectable first pressure detection electrode 52" is formed in second micromechanical functional layer 50. Fixed second pressure detection electrode L0 is formed in uppermost printed conductor level LE of rewiring device U. The advantage of this system is the simplicity of the MEMS process and the low manufacturing costs associated therewith, since only two micromechanical functional layers 40, 50 made of silicon must be used here.

However, an increased stress sensitivity potentially arises with this system, since bending of the application printed circuit board directly results in deformations of fixed pressure detection electrode L0, while such stress is absorbed via bonding frame 60a in the eighth specific embodiment. Moreover, the usage gap between the deflectable pressure detection electrode and fixed pressure detection electrode L0 is subject to higher manufacturing tolerances, since it is defined by the bonding process and not by a layer deposition.

Figure 10:
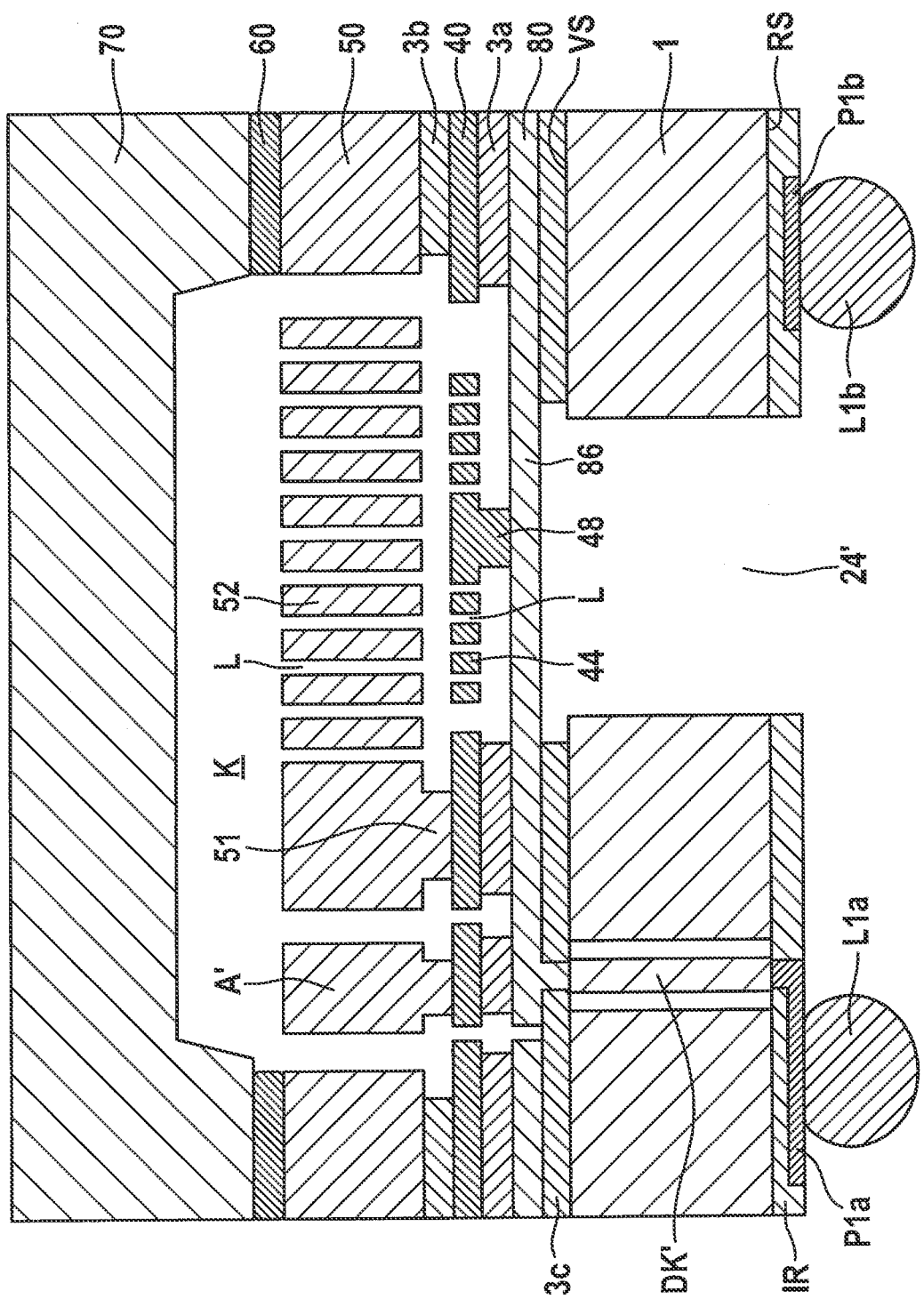
FIG. 10 shows a schematic cross-sectional view to explain a micromechanical pressure sensor device and a corresponding manufacturing method according to a tenth specific embodiment of the present invention.

FIG. 10 shows a schematic cross-sectional view to explain a micromechanical pressure sensor device and a corresponding manufacturing method according to a tenth specific embodiment of the present invention.

In the tenth specific embodiment, the starting point is also the third specific embodiment, additionally a via DK' through MEMS wafer 1 from front side VS to rear side RS being provided. Via DK' is connected to third micromechanical functional layer 80 made of silicon and is thus suitable for conducting sensor signals to rear side RS. Rear side RS is provided with a rear-side insulating layer IR in which connecting pads P1a, P1b are embedded, on which solder balls L1a, L1b are provided. The tenth specific embodiment, as is shown in FIG. 10, may thus also be bonded to a carrier substrate 110, as is shown in FIG. 9, for example.

Figure 11:
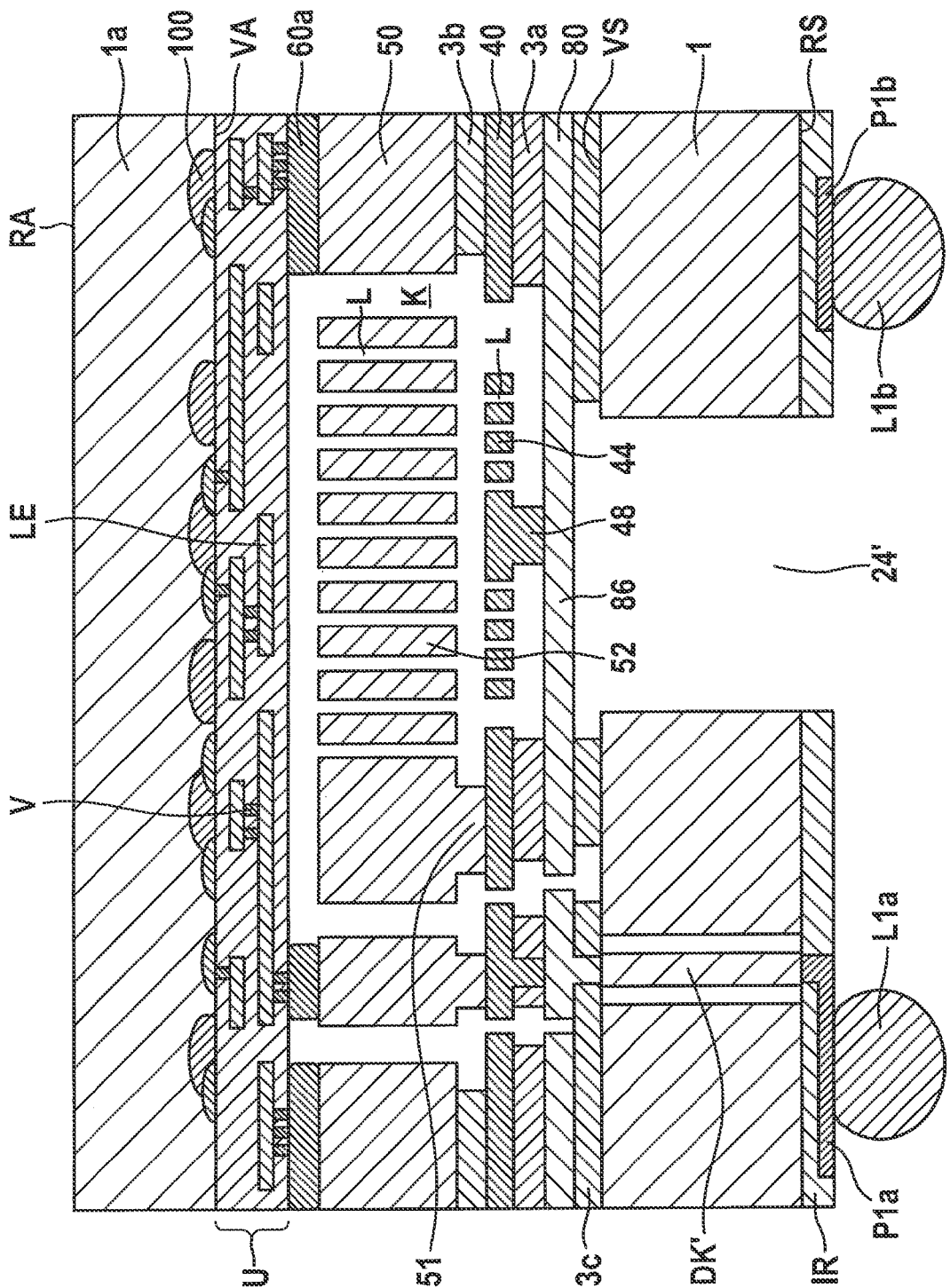
FIG. 11 shows a schematic cross-sectional view to explain a micromechanical pressure sensor device and a corresponding manufacturing method according to an eleventh specific embodiment of the present invention.

FIG. 11 shows a schematic cross-sectional view to explain a micromechanical pressure sensor device and a corresponding manufacturing method according to an eleventh specific embodiment of the present invention.

The eleventh specific embodiment combines the ninth and the tenth specific embodiments. An evaluation wafer 1a is used for capping here; however, the wafer has no via.

As with the tenth specific embodiment, via DK' is provided in MEMS waver 1, whose rear side is provided with insulating layer IR including embedded connecting pads P1a, P1b and solder balls L1a, L1b provided thereon.

The eleventh specific embodiment is analogous to the third specific embodiment in terms of the function of the pressure sensor device.

As an alternative to through-hole 24, 24' in the MEMS wafer from rear side RS, the pressure access may also be implemented via a lateral access opening. For this purpose, for example, a lateral etching channel is created on front side VS of the MEMS wafer and establishes a gas-permeable joint from the chip outer edge to the pressure sensor diaphragm. The channel may be created either in the silicon on front side VS of the MEMS wafer and/or in the oxide layer between the MEMS wafer and the pressure sensor diaphragm. A separate illustration is dispensed with here.

Although the present invention has been described based on preferred exemplary embodiments, it is not limited thereto. In particular, the described materials and topologies are only exemplary and not limited to the described examples.

All implementation forms according to the present invention of the capacitive pressure sensor device have in common that it is also very easy to implement inertial sensor devices, in addition to a pressure sensor device, in the micromechanical functional layers, i.e., that 7D and 10D components may be implemented. In particular the first and second micromechanical functional layers may be used as mechanically movable elements; additionally, if necessary, also the third and/or fourth micromechanical functional layer(s) may be used as wiring levels. Possible additional inertial sensor devices which are created laterally adjoining the pressure sensor device are preferred.

Furthermore it is possible to separate different areas in the integrated component with the aid of bonding webs, so that different internal pressures may be enclosed in separate caverns, for example by using gate materials or by sequentially opening, setting the pressure and re-sealing the caverns.

What is claimed is:
1. A micromechanical pressure sensor device, comprising:
an MEMS wafer having a front side and a rear side;
a first micromechanical functional layer formed above the front side of the MEMS wafer;
a second micromechanical functional layer formed above the first micromechanical functional layer;

a deflectable first pressure detection electrode formed in one of the first and second micromechanical functional layers;

a fixed second pressure detection electrode formed spaced apart from and opposite the deflectable first pressure detection electrode; and an elastically deflectable diaphragm area formed above the front side of the MEMS wafer, wherein an external pressure is applied to the diaphragm area via an access opening in the MEMS wafer, wherein the wafer is joined to the deflectable first pressure detection electrode via a plug-like joining area, and wherein the deflectable first pressure detection electrode is spatially separated from the elastically deflectable diaphragm in a vertical direction by a distance delimited by the plug-like joining area.

2. The micromechanical pressure sensor device as recited in claim 1, wherein the plug-like joining area is formed centrally on the diaphragm area so that the first pressure detection electrode is deflectable essentially untilted.

3. The micromechanical pressure sensor device as recited in claim 2, wherein the diaphragm area is formed in a third micromechanical functional layer, which is formed beneath the first micromechanical functional layer above the front side of the MEMS wafer.

4. The micromechanical pressure sensor device as recited in claim 2, wherein the deflectable first pressure detection electrode is formed in the first micromechanical functional layer, and the fixed second pressure detection electrode is formed in the second micromechanical functional layer.

5. The micromechanical pressure sensor device as recited in claim 2, wherein the deflectable first pressure detection electrode is formed in the second micromechanical functional layer, and the fixed second pressure detection electrode is formed in the first micromechanical functional layer.

6. The micromechanical pressure sensor device as recited in claim 2, wherein the deflectable first pressure detection electrode is formed in the second micromechanical functional layer, and the fixed second pressure detection electrode is formed in a capping device which is bonded to the MEMS wafer.

7. A micromechanical pressure sensor device, comprising:
an MEMS wafer having a front side and a rear side;
a first micromechanical functional layer formed above the front side of the MEMS wafer;
a second micromechanical functional layer formed above the first micromechanical functional layer;
a deflectable first pressure detection electrode formed in one of the first and second micromechanical functional layers;
a fixed second pressure detection electrode formed spaced apart from and opposite the deflectable first pressure detection electrode; and
an elastically deflectable diaphragm area formed above the front side of the MEMS wafer, wherein an external pressure is applied to the diaphragm area via an access opening in the MEMS wafer, and wherein the wafer is joined to the deflectable first pressure detection electrode via a plug-like joining area,
wherein the plug-like joining area is formed decentrally on the diaphragm area, so that the first pressure detection electrode is deflectable in a tilted manner, and two fixed second pressure detection electrodes which are electrically insulated from each other are formed spaced apart from and opposite the deflectable first pressure detection electrode, and wherein the first pressure detection electrode is differently deflectable with respect to the two fixed second pressure detection electrodes.

8. The micromechanical pressure sensor device as recited in claim 1, wherein the deflectable first pressure detection electrode is formed in the first micromechanical functional layer, the fixed second pressure detection electrode is formed in the second micromechanical functional layer, and a further fixed second pressure detection electrode is formed in a third micromechanical functional layer, which is formed beneath the first micromechanical functional layer above the front side of the MEMS wafer.

9. The micromechanical pressure sensor device as recited in claim 8, wherein the deflectable first pressure detection electrode is electrically connected via a spring device which is formed in the first micromechanical functional layer.

10. The micromechanical pressure sensor device as recited in claim 9, wherein a capping device is provided, which is bonded to the second micromechanical functional layer for enclosing a cavern at a predetermined enclosed pressure.

11. The micromechanical pressure sensor device as recited in claim 10, wherein the capping device is an evaluation wafer.

12. The micromechanical pressure sensor device as recited in claim 8, wherein the access opening is a through-hole in the MEMS wafer, through which the pressure is applied to the diaphragm area from the rear side.

13. The micromechanical pressure sensor device as recited in claim 8, wherein the access opening is a lateral access opening on the front side of the MEMS wafer.

14. A method for manufacturing a micromechanical pressure sensor device, comprising:
providing an MEMS wafer having a front side and a rear side;
forming a first micromechanical functional layer above the front side of the MEMS wafer;
forming a second micromechanical functional layer above the first micromechanical functional layer;
forming a deflectable first pressure detection electrode in one of the first and second micromechanical functional layers;
forming a fixed second pressure detection electrode spaced apart from and opposite the deflectable first pressure detection electrode;
forming an elastically deflectable diaphragm area above the front side of the MEMS wafer, to which external pressure is applied via an access opening in the MEMS wafer; and
joining the elastically deflectable diaphragm area to the deflectable first pressure detection electrode via a plug-like joining area, wherein the deflectable first pressure detection electrode is spatially separated from the elastically deflectable diaphragm in a vertical direction by a distance delimited by the plug-like joining area.

* * * * *